Figure 1:
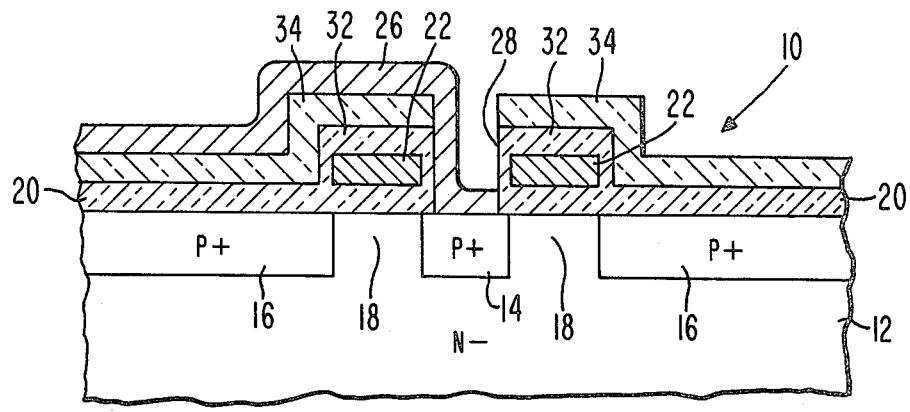

United States Patent [19]

Angle

[11] 4,272,881
[45] Jun. 16, 1981

[54] METHOD FOR MAKING A CLOSED GATE MOS TRANSISTOR WITH SELF-ALIGNED CONTACTS WITH DUAL PASSIVATION LAYER

[75] Inventor: Rodney L. Angle, Somerville, N.J.

[73] Assignee: RCA Corporation, New York, N.Y.

[21] Appl. No.: 59,473

[22] Filed: Jul. 20, 1979

[51] Int. Cl.³ .......................................... H01L 21/26
[52] U.S. Cl. .................... 29/571; 29/576 B; 148/1.5; 148/187; 357/23
[58] Field of Search .............. 29/571, 576 B; 148/187, 148/1.5; 357/23

[56] References Cited

U.S. PATENT DOCUMENTS

| | | | |
|---|---|---|---|
| 3,472,712 | 10/1969 | Bower | 148/1.5 X |
| 3,513,364 | 5/1970 | Heiman | 357/23 |
| 3,608,189 | 9/1971 | Gray | 148/187 X |
| 3,745,647 | 7/1973 | Boleky | 29/571 |
| 4,016,016 | 4/1977 | Ipri | 29/571 X |
| 4,063,274 | 12/1977 | Dingwall | 357/53 |
| 4,081,896 | 4/1978 | Dingwall | 29/571 X |
| 4,149,307 | 4/1979 | Henderson | 148/187 X |
| 4,149,904 | 4/1979 | Jones | 148/1.5 |
| 4,219,379 | 8/1980 | Athanas | 148/187 X |

*Primary Examiner*—G. Ozaki
*Attorney, Agent, or Firm*—Birgit E. Morris; Donald S. Cohen; Sanford J. Asman

[57] ABSTRACT

A method of manufacturing a closed gate MOS transistor having a self-aligned drain contact is presented which insures that the drain contact will have the minimum required geometry. The method employs a self-aligned procedure which insures that the drain contact will be the minimum dimensions to insure a high speed device. Also, the completed device includes a dual layer passivation overcoat which insures a hermetically sealed device.

17 Claims, 6 Drawing Figures

METHOD FOR MAKING A CLOSED GATE MOS TRANSISTOR WITH SELF-ALIGNED CONTACTS WITH DUAL PASSIVATION LAYER

The present invention relates to integrated circuit devices and more particularly relates to an improved insulated gate field effect transistor (IGFET) having a closed gate geometry.

Complimentary symmetry metal oxide semiconductor (COSMOS) integrated circuits employ both N channel IGFETs and P channel IGFETs. Generally, a P well is formed in an N type substrate, and the N channel IGFETs are formed in the P well. The P channel IGFETs are formed in the substrate outside the P well. In one form of COSMOS integrated circuit, which has been described in U.S. Pat. No. 4,063,274 entitled *INTEGRATED CIRCUIT DEVICES INCLUDING BOTH N CHANNEL AND P CHANNEL INSULATED GATE FIELD EFFECT TRANSISTORS*, IGFETs having closed gate geometry structures are described. In such IGFETs, the drain region is surrounded by the gate when the IGFET is viewed from above. Drain capacitance of such IGFETs is related to the area of their drains. In the processing of such closed gate geometry IGFETs, which processing is described more fully in the aforementioned U.S. patent, which is incorporated herein by reference, the drains are formed in one photolithographic step and then another photolithographic step is used to define a contact opening for attaching the metallization, i.e. the drain contact, to the drain.

In order to allow for mask variations, operator tolerance, and other alignment tolerances, the drain of the closed gate geometry IGFETs has heretofore been made larger than necessary to insure adequate contact without shorting to the gate. Accordingly, the drain capacitance of such IGFETs has been increased as a result of the increased drain area. The present invention describes an improved closed gate geometry IGFET which has a minimum drain size and a method for providing self-aligned drain contacts which eliminates the need for alignment tolerances.

In the Drawings:

FIG. 1 is a cross-sectional view of one form of a closed gate geometry IGFET manufactured in accordance with the present invention; and FIGS. 2-6 are cross-sectional views which illustrate the method of manufacturing the IGFET of FIG. 1.

Extensive top and cross sectional views of closed gate geometry IGFETs of the type described herein have heretofore been shown fully in U.S. Pat. No. 4,063,274 which has been incorporated herein by reference. Accordingly, the present description will be limited to a description of that portion of the integrated circuit device which relates to the manufacture of the drain and its associated metal contact. Referring now to FIG. 1, a P channel IGFET 10 employing the present invention is shown. The IGFET 10 is meant to be representative of a typical IGFET of the type employing the present invention, and while a P channel IGFET is described, those skilled in the art will recognize that the description would be equally applicable to an N channel IGFET with appropriately doped regions opposite in conductivity type to that of the P channel IGFET 10.

The IGFET 10 is comprised of a substrate 12 of N− type silicon having a P+ drain region 14 and P+ source region 16. While the P+ source region 16 is shown separated in the cross-sectional view of FIG. 1, it should be recognized that the source region 16 surrounds the drain region 14, from which it is separated by the channel region 18 of the IGFET 10. Overlying the surface of the silicon substrate 12 is a gate oxide layer 20. A conductive polycrystalline silicon gate 22 having a closed geometry overlies the gate oxide 20. An oxide layer 32, to be more fully described hereinafter, overlies the closed geometry gate 22, a silicon nitride layer 34 overlies the oxide layer 32, and a conductive metal drain contact 26 overlies a portion of the silicon nitride layer 34 and makes contact to the drain region 14 through a contact opening 28.

As will be described hereinafter, the method of manufacturing the transistor 10 insures that the contact opening 28, through which the metal conductor 26 makes contact to the drain 14, is of minimum dimension.

Figure 2:
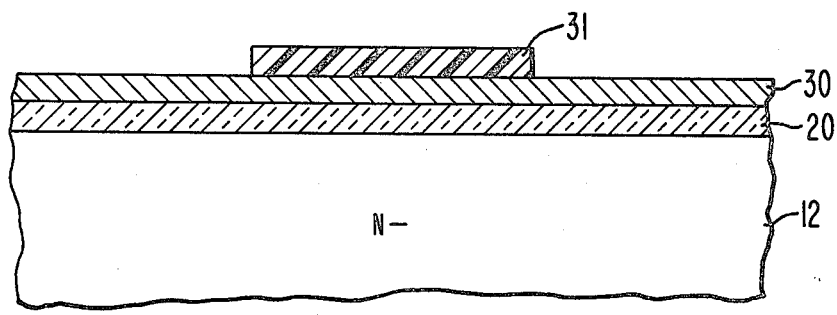

Referring now to FIG. 2, in order to manufacture the IGFET 10 by the present invention one starts with a substrate or body 12 of N− type silicon. A silicon dioxide (gate oxide) layer 20 is formed on the surface of the body 12. Preferably, this step is accomplished by heating the body 12 to a temperature of about 1000° C. in an atmosphere of steam and HCl gas for a time sufficient to grow the oxide layer 20 to a thickness of approximately 1000 Å.

Following the growth of the oxide layer 20 the body 12 is placed in a chemical vapor deposition reactor and a layer of polycrystalline silicon 30 is deposited thereon. Any known method of depositing polycrystalline silicon may be employed, such as the thermal decomposition of silane ($SiH_4$). The process is carried out for a time sufficient to grow the polycrystalline silicon layer 30 to a thickness of about 5000 Å.

Following the deposition of the polycrystalline silicon layer 30, a photoresist layer 31 is applied to the surface of the polycrystalline silicon layer 30. The photoresist layer 31 is defined using a standard photolithographic process and developed to provide a mask which exposes areas of the polycrystalline silicon layer 30 under which the source region 16 is to be formed. Thus, the photoresist layer 31 will cover the area where the drain 14 and gate 22 are to be formed. Using the developed photoresist layer 31 as an etch mask, the exposed portions of the polycrystalline silicon layer 30 are removed using a suitable etchant, such as potassium hydroxide (KOH) or a plasma etch using Freon ($CF_4$), to expose the underlying silicon dioxide layer 20. Next, the exposed portions of the silicon dioxide layer 20 are removed using a suitable etchant, such as buffered hydrofluoric acid (HF).

Figure 3:
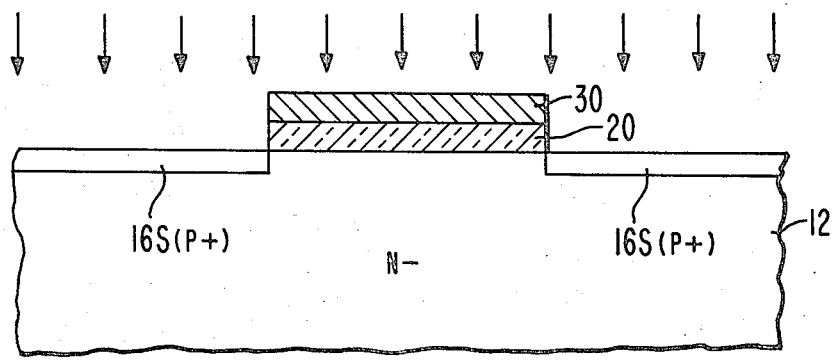

Referring now to FIG. 3, acceptor impurities are then introduced into the substrate 12 to form a shallow region 16S where the source will be formed. At the same time, acceptor impurities are introduced into the polycrystalline silicon layer 30, thereby making it conductive. In the preferred embodiment of the invention, the acceptor impurities are introduced by ion implanting boron ions (represented by the arrows in FIG. 3) at an energy of about 60 KeV to a dosage of about $2 \times 10^{15}$ ions/$cm^2$. While ion implantation is used in the preferred embodiment of the invention, a standard diffusion process or a phosphorus oxychloride ($POCl_3$) process may, alternatively, be used.

Figure 4:
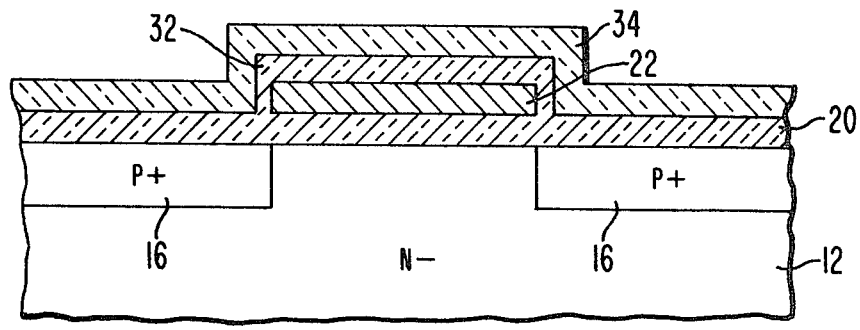

Next, the body 12 is placed into an oxidation furnace to thermally grow an oxide layer 32 on the surface of the doped polycrystalline layer 30 and to regrow the oxide layer 20 on the surface of the substrate as shown in FIG. 4. The oxide layers 32, 20 can be grown in an oxidation furnace heated to about 1000° C. in an atmosphere containing steam and a small quantity of HCl for a time sufficient to grow the layer 32 to a thickness of about 1000 Å. The heating of the substrate 12 will help drive the acceptor impurities into the substrate 12 to form the source 16.

Then, the body 12 is placed into a chemical vapor deposition reactor, and a silicon nitride ($Si_3N_4$) masking layer 34 is deposited on the oxide layer 32. Any known deposition reaction, such as the thermal reaction of silane ($SiH_4$) and ammonia ($NH_3$), may be employed. The process is carried out for a time sufficient to form the layer 34 to a thickness of about 1500 Å to obtain the structure shown in FIG. 4.

Figure 5:
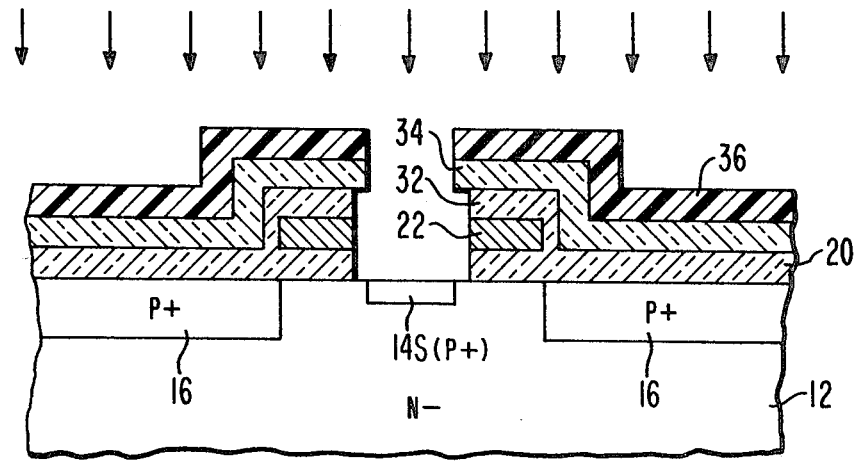

Referring now to FIG. 5, a photoresist layer 36 is deposited on the surface of the silicon nitride layer 34, and the photoresist layer 36 is defined using a standard photolithographic process and then developed to provide openings over areas where drains will be formed. Using the developed photoresist layer 36 as an etch mask, the silicon nitride layer 34 is etched to remove the portions exposed through the mask. The etching of the silicon nitride layer 34 is conducted in an anisotropic etch, i.e. the silicon nitride is not etched at the same rate in every direction, in a plasma reactor with Freon ($CF_4$) at a normal etch rate. At this point, the photoresist layer 36 may be removed (although it is shown on in FIG. 5). The portions of the oxide layer 32 which are exposed following the removal of the exposed portions of the silicon nitride layer 34 are then removed by etching in a $C_3F_8$ plasma etch conducted at normal rates in order to expose portions of the underlying polycrystalline silicon layer 30.

The exposed portions of the polycrystalline silicon layer 30 are then removed by a plasma etch using either $CF_4$ or $C_2F_6$ in an etch conducted at a higher than normal etch rate in order to encourage isotropic etching, i.e. etching in all directions equally. Alternatively, a KOH etch can be used at this point. Following the removal of the exposed portions of the polycrystalline silicon layer 30, the gate structure 22 remains, as shown.

Next, the partially formed device is placed into an etchant for silicon dioxide, such as buffered hydrofluoric acid (HF), in order to remove the exposed portions of the silicon dioxide layer 20 and to expose the surface of the underlying silicon substrate 12.

Then, boron ions are preferably ion implanted (represented by the arrows in FIG. 5) in order to form the shallow P+ region 14S where the drain will be formed. In the preferred embodiment of the invention, the boron ions are implanted at an energy of about 60 KeV to a dosage of about $2 \times 10^{15}$ ions/$cm^2$. As shown in FIG. 5, the implanted ions will substantially align with the edges of the silicon nitride layer 34, and will not reach the edges of the polycrystalline silicon gate 22. As will be seen, an advantage in determining gate-to-drain overlap capacitance can be obtained.

Figure 6:
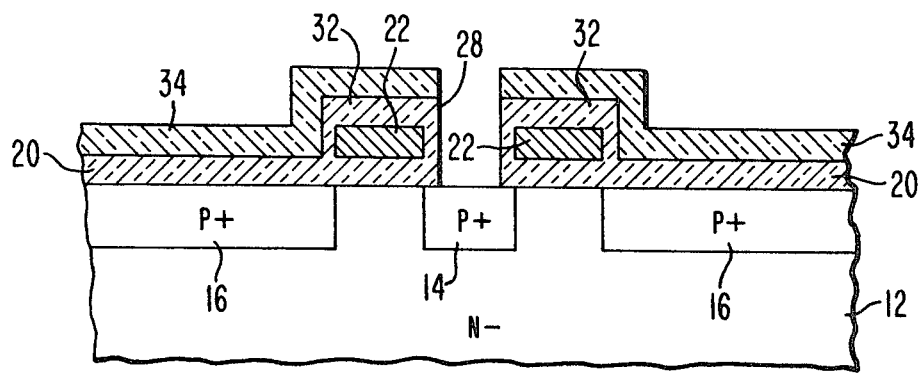

Referring now to FIG. 6, the partially formed device is placed into an oxidation furnace in order to regrow the oxide layer 20 over the surface of the substrate 12, while at the same time growing an oxide on the exposed edges of the polycrystalline silicon gate 22, thereby joining the oxide layers 20, 32 and insulating the gate 22. Simultaneously, the boron ions implanted in the previous step will diffuse into the substrate 12, thereby forming the drain 14. By choosing an appropriate time and temperature for this oxidation step, the side diffusion of the implanted boron ions can be determined in order to minimize the overlap of the drain 14 and source 16 under the gate 22. Accordingly, the drain-to-gate overlap capacitance can be minimized in order to provide very high switching speed devices.

During the preceding step, some silicon dioxide will be formed on the surface of the substrate 12 over the drain 14. An anisotropic plasma etch using either $C_3F_8$ or $CHF_3$ is used to remove the silicon dioxide layer from over the drain 14 (shown removed in FIG. 6), thereby forming the opening 28 and exposing the underlying silicon substrate 12. The plasma etch will not attack either the silicon nitride layer 34 or the portions of the silicon dioxide layers 32, 20 which are shadowed by the silicon nitride layer 34.

Finally, a metal layer is deposited over the surface of the partially formed IGFET 10, and the metal layer is defined and etched using standard photolithographic processes well known in the art to complete the device 10 as shown in FIG. 1.

As will be understood by those skilled in the art, openings to the source region 16 can be made at the same time as the openings to the drain region 14 were made. Also, while a PMOS device has been described herein the formation of NMOS or CMOS devices is done by using appropriately conductive materials.

By using the present invention, minimum size drains can be formed while insuring that proper drain contact can be made. Accordingly, the capacitance of the IGFET produced in accordance with the invention can be minimized thereby maximizing its switching speed. In addition, a dual passivation overcoat of silicon dioxide and silicon nitride results. Accordingly, the device produced by the present invention will be hermetically sealed.

What is claimed is:

1. The method of making a closed gate geometry MOS transistor comprising the steps of:
   (a) selecting a semiconductor substrate of a first conductivity type;
   (b) forming a first insulating layer on a surface of said substrate;
   (c) forming a layer of semiconductor material on the surface of said first insulating layer;
   (d) defining said layer of said semiconductor material to cover the areas where drains and gates will be located in the completed MOS transistor;
   (e) removing the exposed portions of said first insulating layer to expose the surface of said substrate;
   (f) introducing conductivity modifiers, opposite in conductivity type to said substrate, into the exposed surface of said substrate and into said layer of semiconductor material, said conductivity modifiers being used to form the source of said MOS transistor and to make said layer of semiconductor material conductive;
   (g) forming a second insulating layer on the exposed portions of said substrate and on the exposed edges and surface of said conductive semiconductor layer;
   (h) forming a masking layer over the surface of said second insulating layer;
   (i) applying a photoresist layer over the surface of said masking layer and defining and developing said photoresist layer to expose portions of said masking layer through which ohmic contact is to be made to said substrate;

(j) removing the portions of said masking layer, said second insulating layer and said first insulating layer which are exposed through said masking layer there being some undercutting of said masking layer during this step;

(k) introducing conductivity modifiers, opposite in conductivity type to said substrate, into the exposed surface of said substrate, said conductivity modifiers being used to form the drain of said MOS transistor;

(l) forming an insulating layer on the exposed edges of said conductive layer;

(m) removing any insulating layer which directly underlies the edges of said masking layer; and (n) applying a metallic layer over the surface of said device and defining said metallic layer to provide ohmic contacts and interconnects.

2. The method of claim 1 wherein said semiconductor substrate is comprised of silicon and the step of forming a first insulating layer is accomplished by heating said substrate in an oxidizing ambient to form a silicon dioxide layer.

3. The method of claim 2 wherein said step of forming a conductive layer comprises depositing a polycrystalline silicon layer on the surface of said first insulating layer.

4. The method of claim 3 further comprising the step of doping said polycrystalline silicon layer to make it conductive.

5. The method of claim 4 wherein said step of forming a second insulating layer comprises heating said polycrystalline silicon layer and said substrate in an oxidizing ambient to form a layer of silicon dioxide.

6. The method of claim 5 wherein said step of forming a masking layer comprises the step of applying a silicon nitride layer.

7. The method of claim 6 wherein said step of defining said masking layer is accomplished by a photolithographic step followed by etching said silicon nitride layer anisotropically.

8. The method of claim 7 wherein said anisotropic etch is a plasma etch conducted in a plasma reactor with $CF_4$ at a normal etch rate.

9. The method of claim 7 wherein said step of removing the portions of said second insulating layer, said conductive layer, and said first insulating layer are accomplished by etching.

10. The method of claim 9 wherein the etch of said second insulating layer is a $C_3F_8$ plasma etch conducted at normal rates.

11. The method of claim 9 wherein said portions of said conductive layer are removed by etching in a plasma etchant selected from the group consisting of $CF_4$ and $C_2F_6$, which etch is conducted at a higher than normal etch rate in order to encourage isotropic etching.

12. The method of claim 9 wherein said portions of said conductive layer are removed by etching in a KOH etch.

13. The method of claim 9 wherein said first portions of said first insulating layer are removed by etching in buffered hydrofluoric acid (HF).

14. The method of claim 9 wherein said conductivity modifiers are introduced by ion implantation.

15. The method of claim 14 wherein said step of reforming an insulating layer is accomplished by heating in an oxidizing ambient.

16. The method of claim 15 wherein said step of removing the portions of said reformed insulating layer is accomplished by an anisotropic plasma etch using an etchant from the group consisting of $C_3F_8$ and $CHF_3$.

17. The method of claim 16 wherein said step of removing the remaining portions of said masking layer is accomplished by etching in a phosphoric acid ($H_3PO_4$) solution heated to about 80° C.

* * * * *